United States Patent
Blanchard

(10) Patent No.: US 8,803,191 B2
(45) Date of Patent: Aug. 12, 2014

(54) SYSTEMS, DEVICES, AND METHODS WITH INTEGRABLE FET-CONTROLLED LATERAL THYRISTORS

(71) Applicant: Pakal Technologies, LLC, San Francisco, CA (US)

(72) Inventor: Richard A. Blanchard, Los Altos, CA (US)

(73) Assignee: Pakal Technologies LLC, San Francisco, CA (US)

(*) Notice: Subject to any disclaimer, the term of this patent is extended or adjusted under 35 U.S.C. 154(b) by 0 days.

(21) Appl. No.: 13/652,335

(22) Filed: Oct. 15, 2012

(65) Prior Publication Data
US 2013/0175576 A1   Jul. 11, 2013

Related U.S. Application Data

(60) Provisional application No. 61/547,355, filed on Oct. 14, 2011.

(51) Int. Cl.
*H01L 29/74* (2006.01)

(52) U.S. Cl.
USPC .......... 257/141; 438/137; 438/138; 438/237; 438/257; 438/258

(58) Field of Classification Search
USPC .......... 257/141, 147, 175, 107, 138, 153, 144
See application file for complete search history.

(56) References Cited

U.S. PATENT DOCUMENTS

| | | | |
|---|---|---|---|
| 5,477,065 A | 12/1995 | Nakagawa et al. | |
| 5,828,101 A | 10/1998 | Endo | |
| 6,091,107 A | 7/2000 | Amaratunga et al. | |
| 2005/0247962 A1 | 11/2005 | Bhattacharyya | |
| 2007/0235752 A1* | 10/2007 | Rodov et al. | 257/107 |
| 2007/0235804 A1 | 10/2007 | Watanabe et al. | |

OTHER PUBLICATIONS

PCT/US2012/060294 International Search Report and Written Opinion, 20 pages.

\* cited by examiner

*Primary Examiner* — Chuong A Luu
*Assistant Examiner* — Rodolfo Fortich
(74) *Attorney, Agent, or Firm* — Patent Law Group LLP; Brian D Ogonowsky

(57) ABSTRACT

Methods and systems for lateral switched-emitter thyristors in a single-layer implementation. Lateral operation is advantageously achieved by using an embedded gate. Embedded gate plugs are used to controllably invert a portion of the P-base region, so that the electron population at the portion of the inversion layer which is closest to the anode will provide a virtual emitter, and will provide sufficient gain so that the combination of bipolar devices will go into latchup.

20 Claims, 14 Drawing Sheets

Structure of a vertical IGTO. (After Figure 1 of 7,705,368)

A silicon-on-insulator substrate

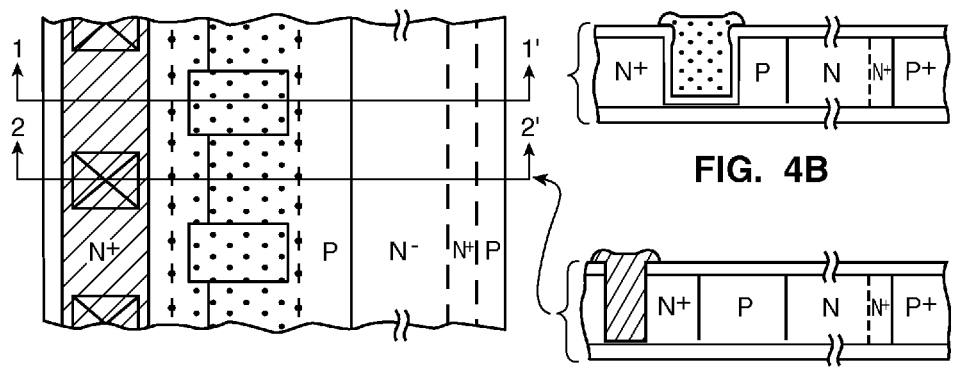
FIG. 4A  FIG. 4B  FIG. 4C
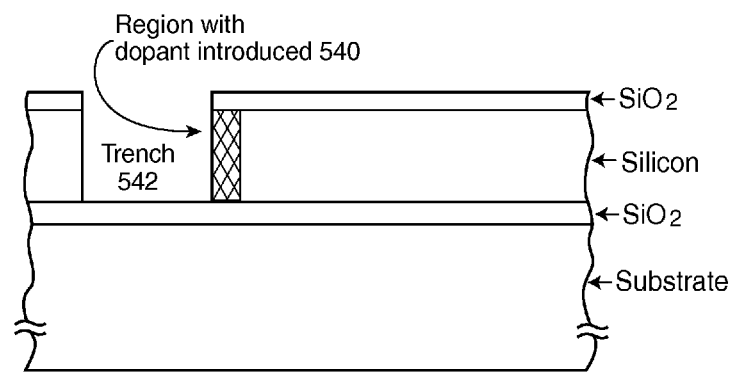
FIG. 5

SYSTEMS, DEVICES, AND METHODS WITH INTEGRABLE FET-CONTROLLED LATERAL THYRISTORS

CROSS-REFERENCE

Priority is claimed from 61/547,355 filed Oct. 14, 2011, which is hereby incorporated by reference.

BACKGROUND

The present application relates to lateral thyristors, and more particularly to lateral FET-controlled thyristors which can be turned on and turned off by a single gate connection.

Note that the points discussed below may reflect the hindsight gained from the disclosed inventions, and are not necessarily admitted to be prior art.

A thyristor is a four-layer solid-state structure which has long been an attractive candidate for high-current switches. Thyristors combine very high current ratings with very high voltage-withstand capabilities, which makes this class of devices the leading candidate for very high voltage switches and for handling very high power. For example, as of 2012, off-the-shelf packaged thyristors can withstand more than 10,000 Volts, and can switch more than 10 Megawatts of power in each unit. However, the basic thyristor structure cannot be turned off by just returning the "turn-on" terminal to 0 Volts, or even to a small negative voltage. Once it is turned on, it stays on for as long as it can draw a minimum holding current.

The basic thyristor structure can be thought of as a merged structure which combines a PNP bipolar transistor with an NPN bipolar transistor. Each of these bipolar transistors provides the base current of the other, so there is potentially a positive feedback relationship: the collector current in the NPN is the base current of the PNP, and the collector current of the PNP is the base current of the NPN. The gain of a bipolar transistor is normally stated as "beta" ($\beta$), which is the ratio of collector current to base current. In a thyristor, there will be positive feedback if the product of the two betas is greater than one ($\beta_{NPN} \cdot \beta_{PNP} > 1$). If this positive feedback relation is present, then, whenever the thyristor is turned ON, it will draw current up to the maximum the external terminals can supply, or until the bipolar devices reach saturation. This condition is often called "latchup" or "latching."

When this basic thyristor is OFF, the junction between the n-base and p-base regions will be reverse biased, and this condition blocks conduction, (The anode will be connected to a voltage which is more positive than the cathode voltage.) A depletion region, with a width depending on the applied voltage, will be present on both sides of this pn-junction formed by the base of the NPN transistor and the base of the PNP transistor. The two other junctions will be forward biased, but no current flows (other than leakage), since the reverse biased junction is present.

When the thyristor is ON, conduction is as follows. (Note that current is carried by both electrons and holes flowing in opposite directions, but current in the conventional sense only flows in one direction.) Holes will pass from the p+ anode region through the n-base region into the p-base region, and thence into the n+ cathode (where they will typically recombine with the majority carriers, which in the n+ region are electrons). Since the holes have positive charge, their movement means that current (in the conventional sense) flows from the anode to the cathode. Similarly, electrons will pass from the n+ cathode region through the p-base region into the n-base region, and thence into the p+ anode (where they will typically recombine with the majority carriers, which in this region are holes). Since the electrons have negative charge, their movement means that current (in the conventional sense) is opposite to the physical movement of the electrons, i.e. current flows from the anode to the cathode. Since current is carried by both electrons and holes, this thyristor is a bipolar (or "minority carrier") device, and operates quite differently than unipolar (or "majority carrier") devices, such as field-effect transistors, where current flows because of the motion of only one carrier type.

When a thyristor has been turned ON, it is electrically analogous to a simple junction diode, but with a lower forward voltage drop than a junction diode.

Turn-on in a thyristor is usually simple, but turn-off is the more difficult challenge in this technology. Many attempts have been made to achieve a thyristor structure which can be turned on and off by a single control terminal. However, many of the proposed devices require large gate currents, and/or have very complex structures, and/or require positive and negative gate drive capability, and/or use separate terminals for turn-on and turn-off gates.

Issued U.S. Pat. No. 7,705,368 to Rodov and Akiyama, which is commonly owned with the present application, described a fundamentally new structure for a MOS-controlled thyristor ("MCT"). The main example described is a vertical device in which a trench gate on the n+ side, when turned on, creates a channel in adjacent p-body material, so that a population at the bottom of the trench is at the same potential as the n+ emitter. This population of electrons provides a "virtual emitter" which increases the gain of the NPN component, and allows the device to go into latchup easily. For turn-off, the same gate is driven negative, so that (preferably) electron flow, in the mesa between adjacent gate trenches, is pinched off. However, a mesa width of less than the Debye length is required for the gate to turn the Rodov et al. device OFF.

The thyristor devices of Rodov et al. have great advantages over IGBTs, but the Rodov et al. devices usually require that the gate voltage be pulsed positive to turn the device ON and negative to turn the device OFF. A power circuit used to control this type of thyristor device would therefore be quite different from the power circuit used to drive most IGBTs, in which the gate voltage is held constant while in the ON state, and returned to zero volts to turn the IGBT off.

An improvement on the Rodov et al. devices is presented in U.S. application Ser. No. 13/632,991 of Blanchard, Akiyama, and Tworzydlo, which is hereby incorporated by reference. This too is a "virtual emitter" device, and can use the same turn-on mechanisms as Rodov. However, the new teaching in this improvement is that the ungated four layer structure will not maintain latchup if the virtual emitter disappears (i.e. if the gate is no longer turned on). This behavior provides easier turn-off. Lifetime control and emitter-base shorts across the NPN transistor can be used to ensure that the bipolar gains are low enough to allow turn-off.

The above examples have been described as vertical devices, i.e. as devices where the current-carrying terminals are on opposite surfaces of the semiconductor die. Vertical devices are usually preferable at the highest voltage and current ratings, since the thickness of the semiconductor material can be adjusted to avoid breakdown at the rated voltage, and most of the area of the die will carry a high current density. However, vertical devices are difficult to integrate with other electronics.

SUMMARY

The present application provides lateral thyristor devices which have a simple structure, and are compatible with a wide range of semiconductor-on-insulator processes. In one example, embedded insulated gates are used to turn on a switched-emitter MOS-Controlled Thyristor structure. Fabrication and operation methods, and chips and systems incorporating such devices, are also advantageously provided.

Advantages of the various disclosed inventions include some or all of the following. Note that some of these advantages relate to different ones of the inventions, and not all of these advantages necessarily result from each of the inventions:

High-voltage drivers can easily be integrated on a single chip with logic circuitry and/or analog circuitry.

Multiple isolated high-voltage drivers can be combined on a single chip.

Less heat-sinking is needed for high-current drivers.

Systems involving motors can be simplified, since a complete motor drive can be integrated on a single chip.

Many systems involving power supplies can also be simplified, since nearly all the components can be integrated on a single chip. Low-power systems may require only one type of external component, namely a discrete inductor; slightly higher-power systems may require only two types of discrete components, namely inductors and capacitors; yet higher-power systems can be designed to use the output of the on-chip thyristors to drive external switching devices.

Systems involving displays can often be simplified, since a complete display driver interface, with high-voltage and/or high-current outputs, can be integrated on a single chip. This is particularly advantageous for glow-discharge displays, which may require high voltages to initiate conduction.

BRIEF DESCRIPTION OF THE DRAWINGS

The disclosed inventions will be described with reference to the accompanying drawings, which show important sample embodiments and which are incorporated in the specification hereof by reference, wherein:

FIGS. 4A-4C show a sample embodiment of a thick-layer lateral IGTO.

FIG. 5 shows a sample embodiment of a novel technique that can be used to realize the present inventions.

DETAILED DESCRIPTION OF SAMPLE EMBODIMENTS

Figure 1:
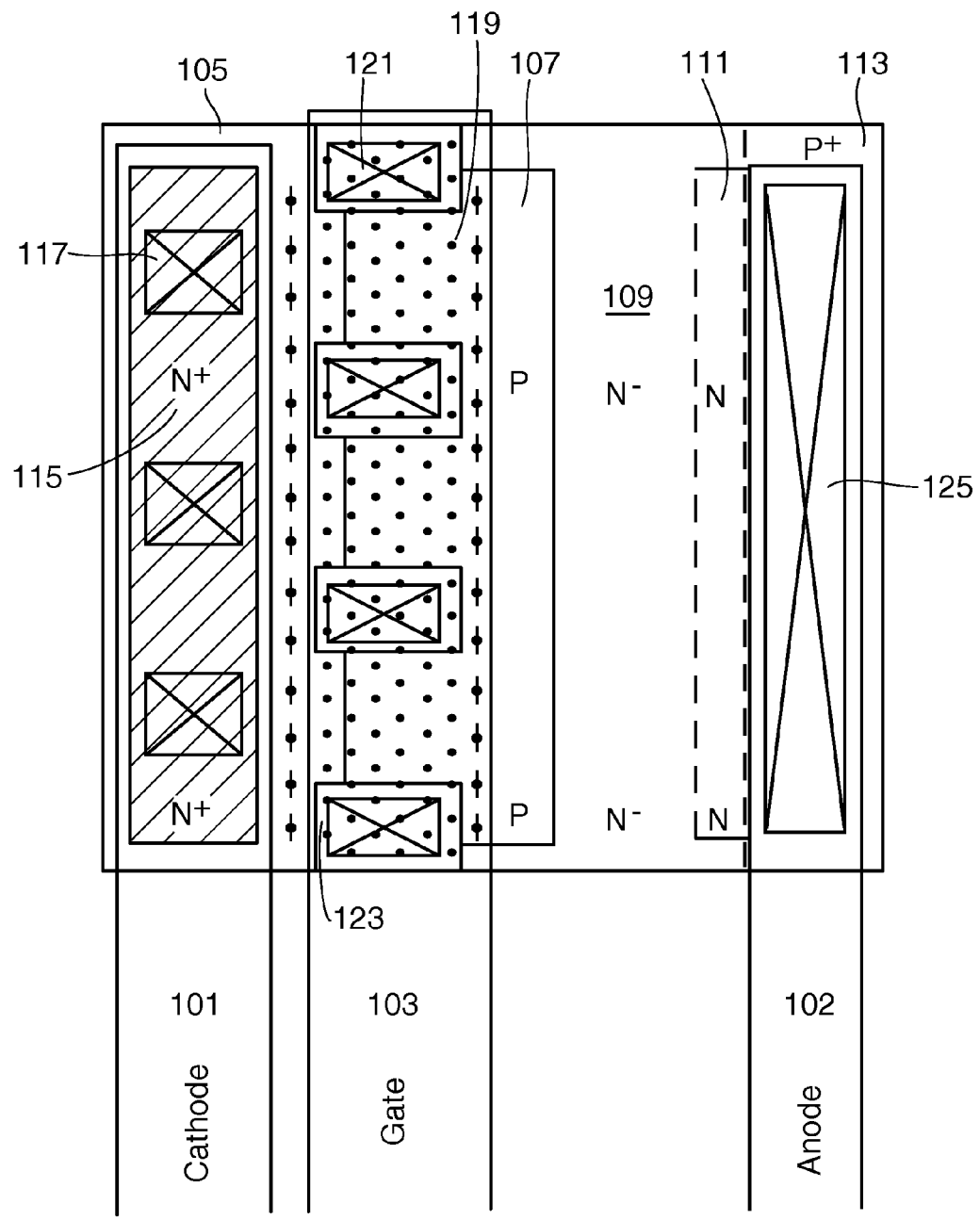
FIG. 1 shows a sample embodiment of the present inventions.

The numerous innovative teachings of the present application will be described with particular reference to presently preferred embodiments (by way of example, and not of limitation). The present application describes several inventions, and none of the statements below should be taken as limiting the claims generally.

Co-pending and commonly-owned application Ser. No. 13/632,991 discloses new approaches to gate-controlled thyristors. There are some apparent structural similarities to Rodov—e.g., a trench gate is still used—but with important differences in structure and operation. With no gate voltage applied, the product of the gain of the NPN times the gain of the PNP is preferably less than unity. This means that even if the device is somehow triggered into conduction, it will not latch. However, if the trench gate is turned on (driven sufficiently positive), an inversion layer forms at the trench sidewalls and bottom. In this inversion layer, electrons are the majority carriers, so the population of electrons at the bottom of the trench provides a "virtual emitter" for the NPN bipolar transistor. The behavior of the NPN is now determined by this virtual (induced) emitter, not by the n+ diffusion at the top surface. In effect, the NPN device has been changed from a wide-base bipolar transistor, with correspondingly low gain, to a bipolar NPN with a much narrower base. As with any bipolar transistor, a reduction in base width, while other device parameters remain unchanged, greatly increases the gain (beta) of this transistor. Thus the gate can change the NPN from being a wide-base transistor to being a narrow-base transistor.

The disclosed innovations, in various embodiments, provide one or more of at least the following advantages. However, not all of these advantages result from every one of the innovations disclosed, and this list of advantages does not limit the various claimed inventions.

Single-layer lateral thyristor

Manufacturable

In general, a thyristor can be thought of as the combination of a reverse-biased junction (the base-base junction), which provides all the voltage withstand in the OFF state, with two base-emitter junctions on opposite sides of the base-base junction. (These two additional junctions are electrically in series with the base-base junction, and are forward-biased but not conducting in the OFF state.) In the ON state, the combination of the two emitter-base junctions provides net round-trip carrier multiplication, so the device latches when it is turned on.

Rodov et al. U.S. Pat. No. 7,705,368 describes a gated thyristor device where the connection to one of the emitters is pinched off to interrupt conduction.

Co-pending application Ser. No. 13/632,991 teaches that thicknesses and dopings should be selected so that the combination of the two metallurgical emitter-base junctions will not latch by themselves. Thus the preferred implementations disclosed in co-pending application Ser. No. 13/632,991 differ from the preferred implementations of Rodov et al., both in structure and in function. The structure is different, in that the two metallurgical emitter-base junctions do not provide net round-trip carrier multiplication by themselves (i.e. not unless a portion of the upper base has been inverted). That behavior translates into different thicknesses and/or dopings and/or carrier lifetimes, as discussed below. The function is surprisingly different, in that carrier multiplication between the two emitter-base junctions does not have to be disabled in the OFF state.

To analyze carrier multiplication, a crucial relation is the product of the NPN and PNP current gains: if (at the relevant voltage and current)

$$\beta_{NPN}\beta_{PNP} > 1,$$

then the device will latch when triggered; but if $$\beta_{NPN}\beta_{PNP} < 1,$$

the device will not sustain conduction, even if it has already been turned on.

Co-pending application Ser. No. 13/632,991, by changing the gain of the NPN transistor, allows BOTH of these states to be achieved. The relevant relations are now:

$$\beta_{NPN\text{-}wide} < 1/\beta_{PNP}, \text{ and}$$

$$\beta_{NPN\text{-}narrow} > 1/\beta_{PNP}.$$

That is, the NPN beta is not only changed by shifting between wide-base and narrow-base behaviors, but the product of the betas will change between a value which is less than unity in the OFF state, and a value which is greater than unity in the ON state. There are two additional tools which can be used to assure that these two beta-products fall on different sides of unity.

In addition to the switch between wide-base and narrow-base operation, both gains are reduced as needed by reducing carrier lifetime. This can be done by introducing deep-level dopants (such as gold or platinum), or by irradiation using electrons or other high energy particles, followed by an anneal. (Electron irradiation is currently the most preferred implementation.) This carrier lifetime reduction has unexpected synergy when used in combination with switching between wide- and narrow-base operation.

In the narrow-base condition, conduction is preferably initiated merely by placing a positive voltage on the anode terminal. The positive voltage on the anode attracts electrons from the virtual emitter induced at the trench bottom (i.e. the population of electrons in the inversion layer induced in the p-base layer at the bottom of the gate trench). Electrons will flow through the portion of the p-base below the trench, to initiate the positive-feedback relation which turns the device fully ON.

While it might seem desirable to adapt vertical IGTOs as seen in e.g. Rodov and co-pending application Ser. No. 13/632,991 to lateral IGTOs, this is surprisingly difficult. Existing lateral thyristors tend to be very complicated.

Two classes of sample embodiments which are particularly interesting are thin lateral IGTOs and thick lateral IGTOs. In one sample embodiment of thin-layer lateral IGTOs, dopant is introduced only through the top surface of the wafer. In one sample embodiment of thick-layer lateral IGTOs, dopant is introduced e.g. along vertical surfaces that are exposed by etching the wafer.

FIG. 1 shows a sample embodiment of the present invention. An example of a process flow of a thin-layer sample embodiment of the present invention follows. Dopants are implanted into lightly-doped n-type poly silicon or recrystallized silicon to provide N+ cathode stripe 105 and P+ anode stripe 113. In between those stripes, a P-type base region 107 is formed by implantation. The N- or N-base region 109 is typically the starting material before all implantations. Then, for example, the trenches 123 are etched down to the underlying oxide, and thin oxides (gate oxides) are formed on the sidewalls of those trenches. This can be done, for example, by oxidation. Then, a polysilicon layer is preferably deposited to form a stripe 119 which not only partially fills the trenches, but also forms a continuous stripe over all of the trenches. (At this point, it is optionally possible to planarize the poly layer, to assure reliable contact formation.) After this, an inter-level dielectric will typically be deposited over the poly layer, e.g. a low-density silicon dioxide. Next, contact openings will be etched in a single step, for multiple contacts to the cathode region, multiple contacts to the gate region, and one or more contacts to the anode region. Next, metallization will be applied by conventional methods to fill the contact holes 117, 121, and 125. This can be tungsten, or can be doped polysilicon, or can be Al:Si. Next, the overlying metal layer 115 is deposited and etched to form at least three stripes: a cathode contact stripe 101, a gate contact stripe 103, and an anode contact stripe 102. The numerous contacts to the poly stripe, as shown in this example, help to ensure that the RC time delay is low and uniform across all gates in the gate stripe. This avoids any problem from one gate turning on before another does.

In one sample embodiment of a thin lateral SOI IGTO, the thickness of the layer of semiconductor material is e.g. a factor of 1-4 less than the lateral distance that the doped regions diffuse to obtain the final doping profile.

All the dopant introduced into the layer of semiconductor material is allowed to diffuse until an essentially constant vertical profile is obtained. This constant vertical dopant profile allows each of the junctions to perform as required for the lateral IGTO to operate as expected.

It is possible to adjust the depth of the peak of the implanted dopant region by selecting the implant energy. For a given dopant species, the implant energy determines the location of the peak of the dopant profile.

All but the most heavily doped region can be formed using a single implant step or multiple implant steps. In either instance, a drive-in step activates the dopant atoms that have been introduced and cause them to diffuse to their final location. If multiple implants are performed, each implant will be at a different energy to obtain a more uniform vertical dopant profile and simultaneously reduce the drive-in required.

One sample embodiment of a thin lateral IGTO can have e.g. the following dimensions and peak dopings. The semiconductor layer is e.g. 8 microns thick, but this thickness depends on the voltage desired. N+ cathode region 105 is e.g. 6-10 microns wide, and has a peak doping of, for example, $5 \times 10^{19}$ cm$^{-3}$ or greater. P region 107 is e.g. 4-8 microns wide and has a peak doping of, for example, $10^{16}$-$10^{18}$ cm$^{-3}$. Gate poly 119 is e.g. 6-10 microns wide. Gate poly stripe 119 has a thickness of e.g. 1-2 microns on the top surface of the device, with the possible exception of locations where it crosses over the gate trenches. The openings for the embedded gates have a width less than 2-4 microns so the poly fills them during the deposition step. N-region 109 has a width of e.g. 40-60 microns, and has a peak doping of, for example, $10^{13}$-$10^{15}$ cm$^{-3}$. N buffer region 111 has a width of e.g. 3-6 microns, and a peak doping of, for example, $10^{15}$-$10^{16}$ cm$^{-3}$. P+ anode region 113 is 6-10 microns wide, and has a peak doping of, for example, $10^{19}$ cm$^{-3}$ or greater.

N buffer region 111 serves to reduce the regenerative emission of holes and therefore adjust the gain of the PNP device. If the gain of the PNP device is too high, the device will stay latched once latched.

In one sample embodiment, contact openings 117 are e.g. 2 microns by 2 microns, and are spaced e.g. 1 micron or more apart.

Figure 2:
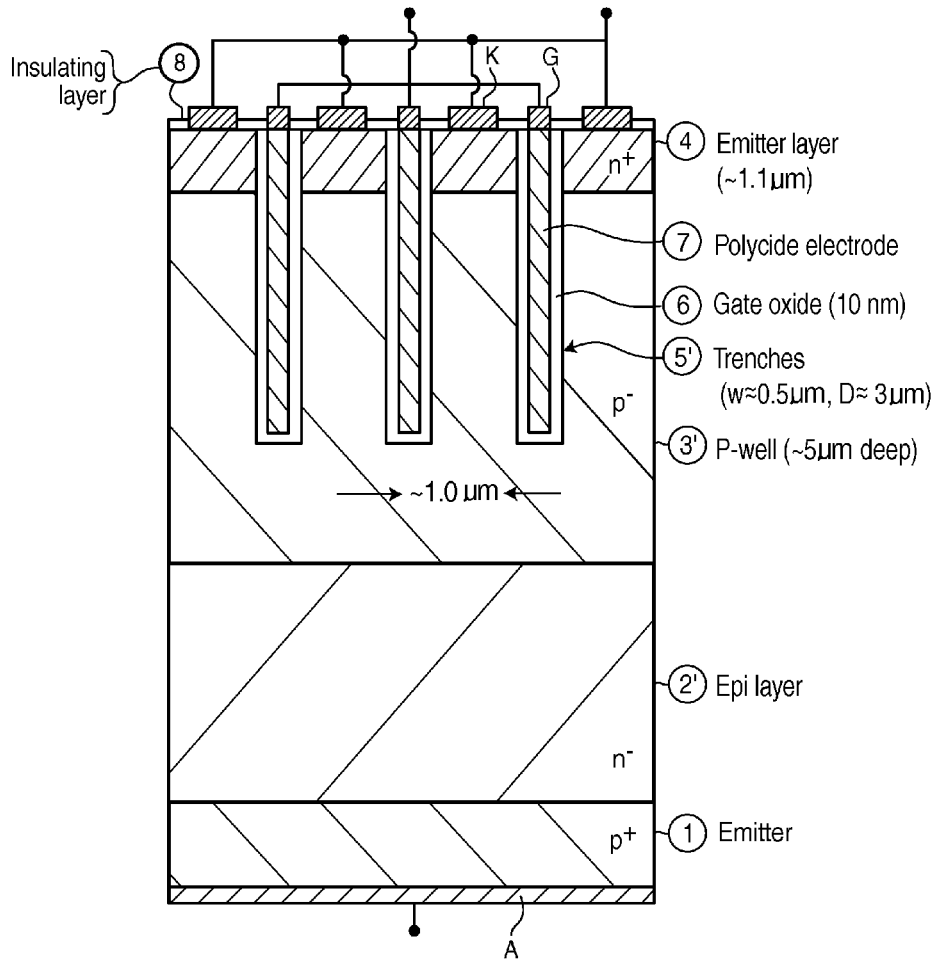
FIG. 2 shows an example of a vertical IGTO.

FIG. 2 shows an example of a vertical IGTO.

Figure 3:
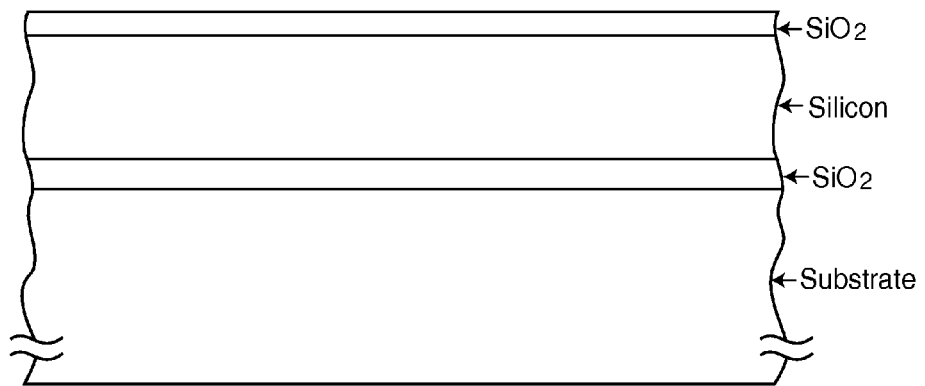
FIG. 3 shows an example of a semiconductor-on-insulator substrate.

FIG. 3 shows one sample embodiment of a semiconductor-on-insulator (SOI) substrate which has facilitated realization of the present inventions.

FIGS. 4A-4C show one sample embodiment of a thick lateral IGTO. FIG. 4A shows a top view of this sample embodiment, and FIGS. 4B and 4C show two cross sections. One or more trenches 417 are preferably formed in the cathode end of the starting material, in the region that will become N+ cathode region 405. One or more trenches are also preferably formed at the anode (P+) end of the device. The dopant is preferably introduced for all junctions through these trenches.

In the sample embodiment of FIGS. 4A-4C, trenches 417 are preferably offset from gate contact trenches 423, in that trenches 417 and trenches 423 will preferably not both be present in a given cross section of the device.

Typical SOI digital processes, and to some extent analog processes, will use a relatively thin semiconductor layer, e.g. on the order of a micron or perhaps two, when lithographic critical dimension (CD) is of the order of 100 nm. Thicker substrates, in such processes, can create problems with backside leakage and isolation. Thus, the sample device of FIGS. 4A-4C is somewhat less compatible for advanced-process circuit integration than the thinner device of FIG. 1 is. However, it is alternatively possible to include, e.g., an oxygen implant in the small signal circuits, or other process modifications to combine a thick thyristor device with a small signal SOI circuitry of normal thickness.

FIG. 5 shows a detail of how the lateral diffusion of the anode and cathode diffusions can typically be implemented on the cathode side. A similar lateral diffusion can be performed on the anode side.

This permits an equal amount of on-state conductivity to be achieved without using as much area of the semiconductor. However, for such devices, vertical uniformity of the doping is a concern. This is important because in any high-current bipolar device, current-hogging is important to avoid. That is, if the device turns on non-uniformly, the location where turn-on has occurred first can be in a negative impedance state, and can therefore draw more and more current, until localized melting or other undesirable effects occur. When the vertical dimension of the thyristor is significant (e.g. more than 4 microns), non-uniformity of turn-on in the vertical direction becomes a concern. The dopant introduction structure as shown in FIG. 5 is therefore an advantageous response to avoid this problem. Since turn-on is initiated, in this example, from the cathode side, non-uniformity on the cathode side is even more of a concern than non-uniform turn-on on the anode side. Thus, one embodiment uses a vertical dopant source as shown in FIG. 5 on the cathode side, but not on the anode side. More preferably, vertical dopant introduction can be used on both anode and cathode side, with analogous trenches.

Depending on the technology being used to introduce the doping, isolation will not be achieved across trench 542. This is very likely to be the case if a solid doping source, such as in situ doped n++ poly, is used, and can also be a concern even with implantation. Thus, in many embodiments, it is preferred to not rely on the dopant introduction trench for isolation, but to also have an isolation trench which is outboard of this dopant introduction trench 542. This isolation trench preferably cuts down all the way to oxide, and can be, e.g., 1-50 microns wide, depending on the operating voltage and radiation environment.

For the thick-layer class of sample embodiments, dopant is preferably driven in through the sidewall of an opened trench. One such trench is formed at the anode end of the device, and another such trench is formed at the cathode end of the device. The dopant is preferably introduced for all junctions through these trenches, in some advantageous implementations. For example, with a lightly doped n-type starting layer, a high-mobility acceptor dopant can be introduced at the vertical trench wall, and driven from there. This assures that the critical base-base junction will have a completely vertical profile. If implantation is done from the surface to form the P base, the implant will typically have a range and straggle, as is well known to those of ordinary skill in the art. The unavoidable consequence of this is that there will be some vertical variation in the level of doping in the P-base there formed. This can be compensated to some extent by using multiple implants and subsequent out-diffusion, but lateral diffusion of this from the vertical trench wall which will provide the n+ diffusion source is also an advantageous option. This acceptor dopant will be followed by a heavy and shorter diffusion length introduction of donor dopants, to form the n+ cathode contact.

The dopant can be introduced using ion implantation on the sidewall of the trench, or by depositing a suitably doped material on the sidewall. If ion implantation on the sidewall of the trench is used, contact will most likely be made along the exposed trench sidewall. In this case, a low energy heavy-dose implant is most preferably used, and one of the slower-diffusing donor dopants (such as As or Sb in silicon) is preferably used. If poly is used for doping, it can either fill the trench, resulting in a poly region on the surface where contact can be made, or can cover the interior of the trench, allowing the metal layer to contact the poly, which in turn contacts the single crystal silicon. If doped oxide is used to dope the silicon, it is removed prior to contact formation, leaving doped sidewalls, which are contacted as previously described.

In one sample embodiment of a thick lateral SOI IGTO, the thickness of the layer of semiconductor material is, for example, 4 microns or greater, or e.g. a factor of 1-4 greater than the lateral distance that the doped regions diffuse to obtain the final doping profile. The dopant species for each doped region can be introduced at an exposed vertical surface 540 that extends entirely through the semiconductor layer as seen in e.g. FIG. 5. Dopant is then diffused for a specified time so that the desired doping profile is obtained. Dopant can be introduced on exposed vertical surfaces in e.g. the following ways:

Conventional ion implantation at an angle so that the dopant atoms are introduced directly into the vertical surface;
Immersion ion implantation, which introduces dopant into all surfaces in a direction perpendicular to the surface;
Diffusion into the semiconductor from a plasma or gaseous dopant source; or
Diffusion into the semiconductor from a solid source (e.g. doped oxide or doped poly or another solid state dopant source, such as $POCl_3$ or modern alternatives) that has formed or been deposited on the vertical semiconductor surface.

Overlapping diffused regions (e.g. base and emitter regions) can be formed by introducing and diffusing dopants sequentially in the same region. In one sample embodiment, the deeper p-type region is formed first by introducing a constant amount of p-type dopant per unit area along the exposed vertical surface and then diffusing it to the desired depth. Next, the N+ cathode dopant is introduced at the same surface and subsequently diffused to its final depth. In a similar fashion, the N+ buffer layer dopant and the P+ anode dopant are introduced at the vertical surface at the other terminal of the device.

Figure 6A:
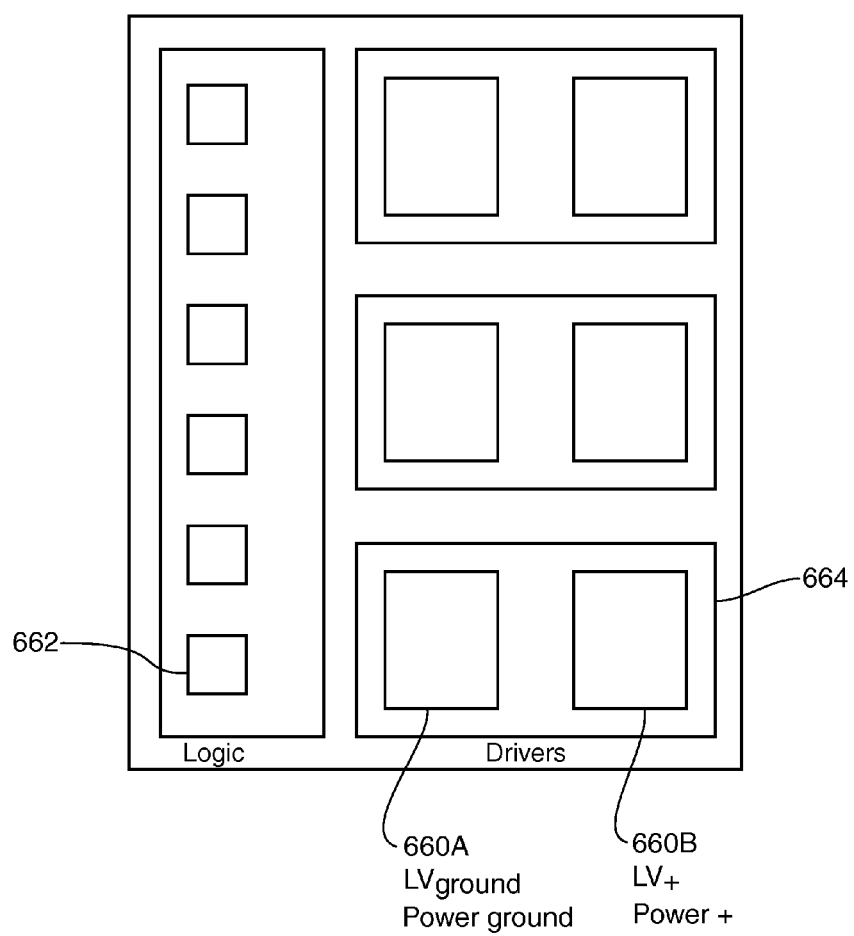
FIG. 6A shows a top view of one sample embodiment of lateral device integration.
Figure 6B:
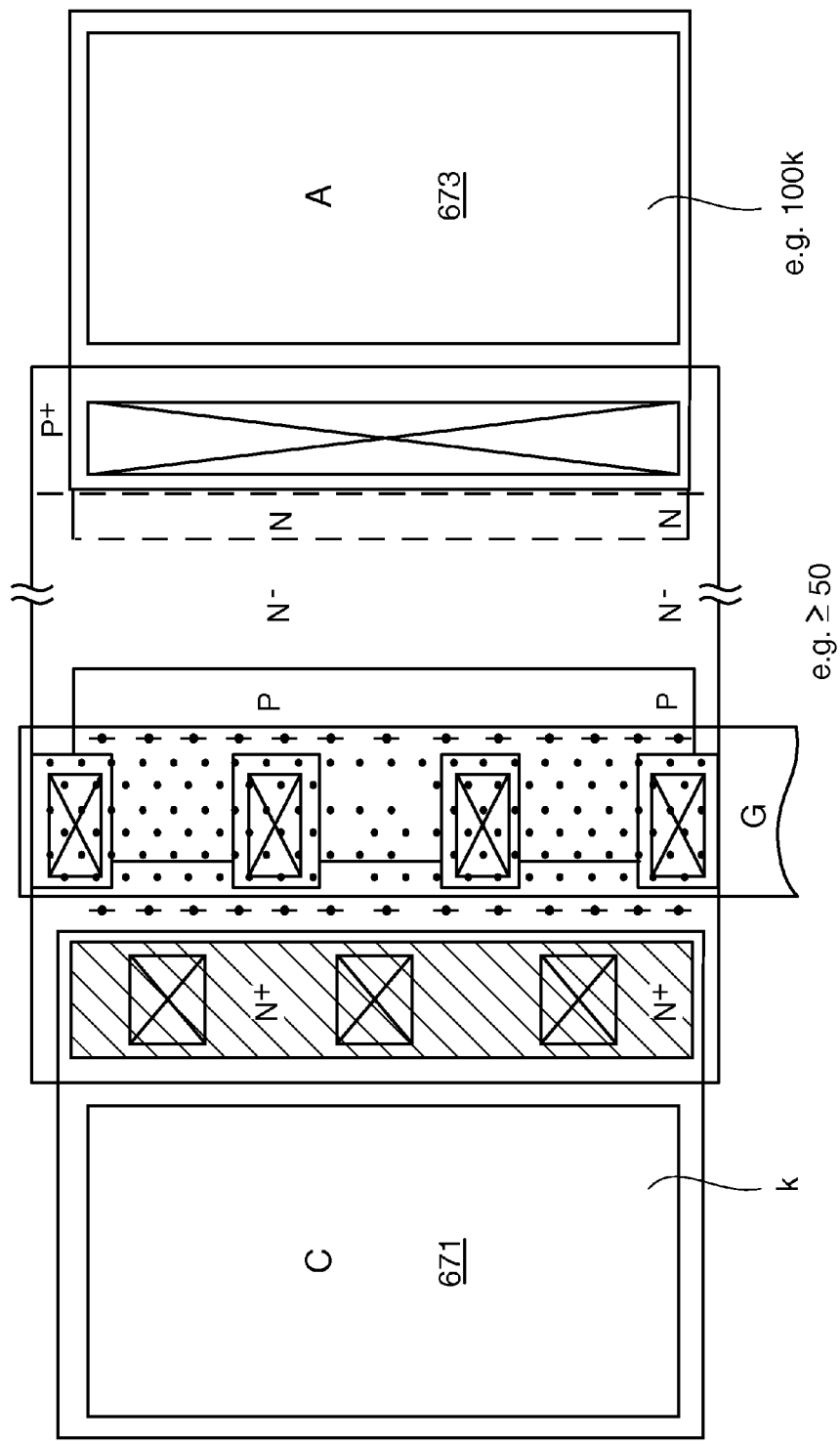
FIG. 6B shows one sample embodiment of a lateral IGTO that can be used in such an integration.

FIGS. 6A-6B show an example of how this structure permits integration of thyristor devices, for high-voltage and/or high-current handling, on the same die as logic or analog circuits. The ability to drive multiple channels of high voltage with a thyristor device can be particularly advantageous for, for example, a driver for glow-discharge displays, a variable-speed drive for small motors, or a crowbar switch for protection against transients or overload conditions. FIG. 6A shows one sample embodiment with multiple lateral devices integrated on a single die. Input pads 662 in the logic block can preferably be used as input for power and signals, as well as for ground. Each of drivers 664 has two pads 660 configured for power. Pad 660A ($LV_{ground}$) is preferably configured for ground, and pad 660B ($LV_+$) is preferably configured for, for example, 5 V. Ground terminals 660A are preferably isolated to avoid noise. Driver elements 664 can be, for example, the lateral IGTO shown in FIG. 6B. The bonding pads for cathode 671 and anode 673 can be e.g. 100 microns×100 microns.

Figure 7:
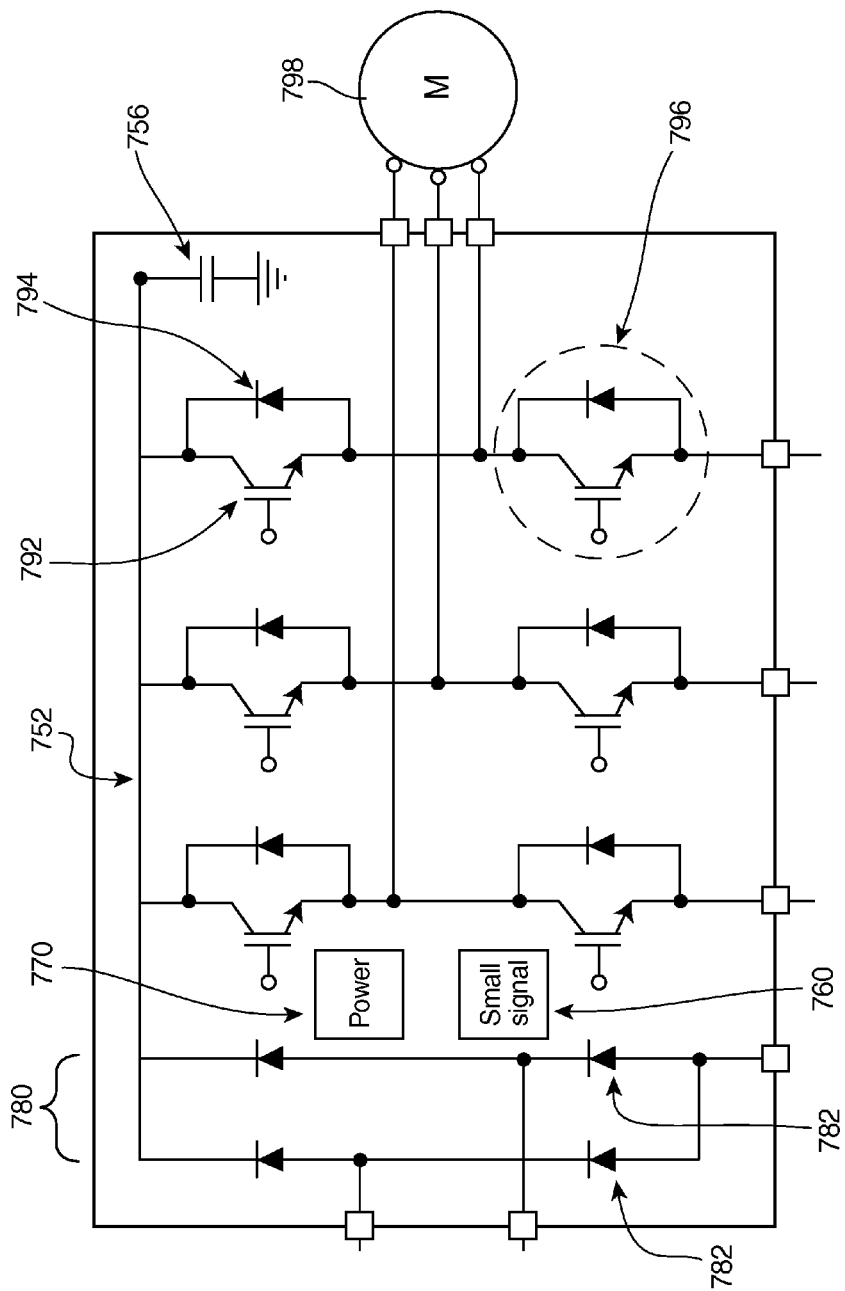
FIG. 7 shows an example of a motor drive circuit.

FIG. 7 shows an example of a drive circuit for an induction motor or permanent-magnet motor 798. Depending on the control circuits, this can be a variable-speed drive, or can be a simple AC motor drive. The simplest implementation of this is to provide six separate SOI islands, on the same die, for the six illustrated thyristors 792. In this example each thyristor 792 is connected to an antiparallel diode 794, but this is not required in all implementations. In the most straightforward implementation, the diodes 794 are each located in their own separate SOI islands, but modifications are also possible.

In this example, a full-wave rectifier 780 is also shown on-chip, to provide though it is easier to use a separate off-chip component to provide a smooth or rippled DC voltage. This drives a supply rail 752 to a positive voltage. Optional capacitor 756 filters out some of the ripple.

In this example, each phase leg contains two thyristor+diode combinations 796. Each of these, in this example, includes a thyristor 792 like those in FIG. 1 or FIGS. 4A-4C, plus an antiparallel diode 794.

Small-signal circuitry 760 (which can include logic or analog or both) provides gate drive for the thyristors 792. Optionally a low-voltage power supply module 770 can have its own separate island, especially if it is deriving power from the supply rail 752. It is more preferable for module 760 to receive power from a separate off-chip connection.

Figure 8:
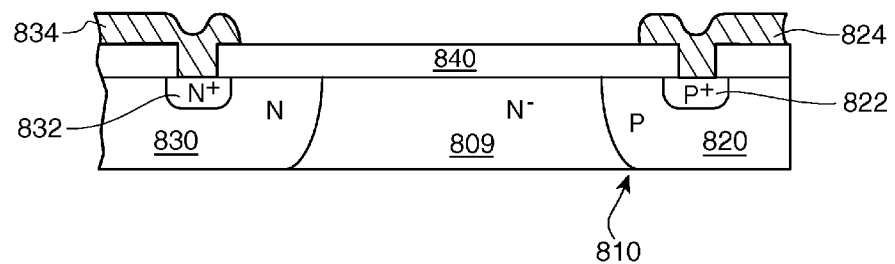
FIG. 8 shows a sample diode configuration.

FIG. 8 shows an example of a simple junction diode. Junction 810 provides a rectification between an n-type cathode region 830 and a p-type anode region 820. The starting semiconductor material 801 preferably has a very light doping, and provides the length needed to deplete without breakdown at a high applied voltage. Of course this length can be easily adjusted for whatever voltage is chosen. Metallization 834 makes contact to an n+ cathode contact region, and thereby to the n-type cathode region 830. This region 830 preferably has a higher doping than the n-type drift region 809. Similarly, anode metallization 824 makes contact to p+ anode contact region 822, also through dielectric 840. Dielectric 840 preferably includes a carefully-grown bottom oxide, at the interface to n-type drift region 809, to avoid leakage. In this example, the n-type cathode region 830, and the p-type anode region 820, are both formed by an implantation through the holes which form the contact for the metallizations 824 and 834. Note that this can optionally be done by two implantation steps, so that junction 810, and the boundary between n-type cathode region 830 and n-type drift region 809 is reasonably far removed from the anode contact region 822 and the cathode contact region 832. This provides a rectifying diode, which can easily be dimensioned so as to withstand whatever voltage is required for the antiparallel diode's rating. This simple diode structure can provide the antiparallel diode shown, for example, in FIG. 7.

N-region 809 can preferably be the same as N-region 109 or 409 when integrated on a die with e.g. the lateral IGTO of FIG. 1 or FIGS. 4A-4C or their equivalents, respectively.

Figure 9:
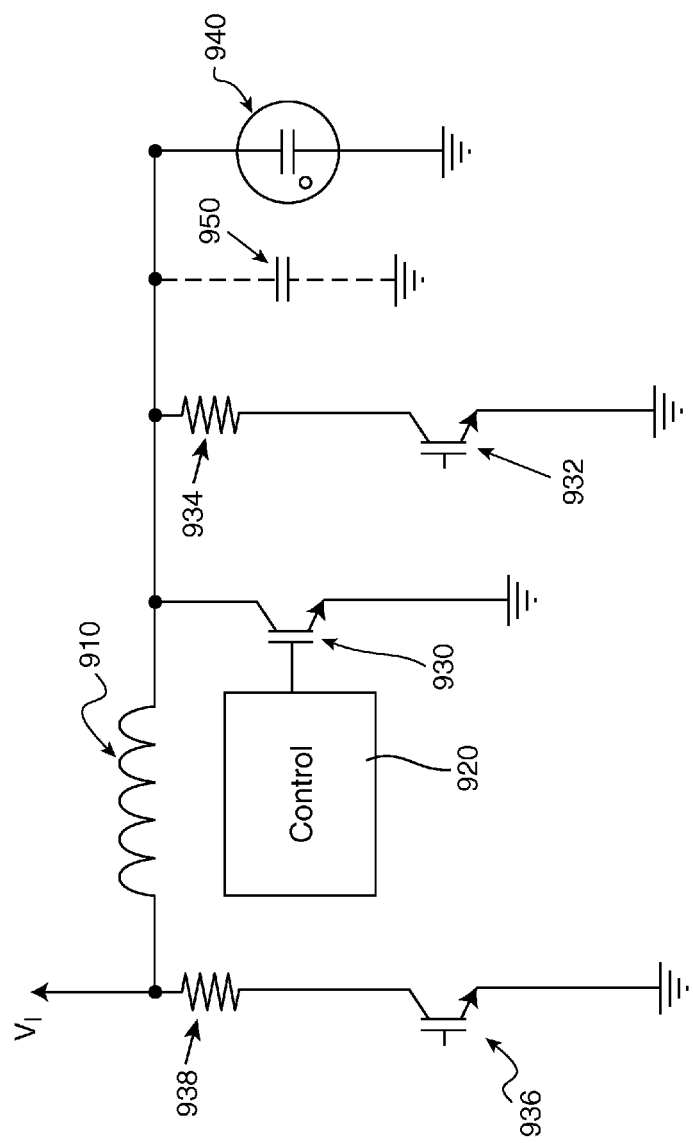
FIG. 9 shows a sample configuration for a glow-discharge-lamp driver.

FIG. 9 shows one example of a lamp driver configuration, which can be used for glow discharge lamps and the like. The thyristors of FIGS. 1 and 4A-4C are particularly advantageous in this configuration, since they can be designed to withstand the high voltage which may be required to initiate the conduction. Glow discharge lamps normally have an I-V plot, like many other negative impedance devices, where conduction is not initiated until a certain breakdown voltage is reached, and then continues until the lamp no longer receives its required minimum holding current. After the lamp is turned off, there will be some remaining population of ions, so that while this population is recombining the breakdown voltage will lower than it was in the completely quenched state.

In this configuration, when the thyristor 930 first turns on, it will sink current through inductor 910 from supply voltage V1. Once the inductor 910 has a desired amount of energy, the control circuitry 920 turns off the thyristor 910. Inductor 910 will then continue to conduct current, so that the voltage at the anode of thyristor 930 will rise rapidly. (The rate of rise at this time will be determined by the parasitic capacitances of thyristor 930 and lamp 940, and also by the capacitance of an optional high-voltage capacitor 950 if such is used.) Once conduction has started, the current through inductor 910 will equilibrate at the steady-state draw required by lamp 940; note that this can be different than the current drawn by the thyristor 930, and may be much less.

There are some design considerations to achieve reliable restart. When the lamp 940 is sought to be turned off, control circuitry will turn on optional thyristor 932. The resistor 934 is preferably large enough to divert enough current so that the lamp 940 will quench fully. Once the lamp is quenched, thyristor 932 can be turned off once the inductor's energy has been reduced enough not to restart the lamp. Preferably a resistor 938 and thyristor 936 are used to temporarily reduce voltage across the inductor, but these are optional. Thyristor 932 can be pulsed intermittently for an interim period, to increase the time-averaged net impedance of resistor 934 as seen by the inductor. Also, thyristor 930 can be pulsed to reduce the voltage rise from the inductor 910, especially if optional capacitor 950 is used. Turnoff management is affected by a combination of factors, including: the curve of restart voltage versus time after quench of the particular plasma; the ratios of the on-state current draw through the plasma to the currents drawn by thyristors 932, 930, and/or 935; the inductance and parasitics of the inductor 910; the capacitance of capacitor 950, if present; and the parasitics of lamp 940. Those of ordinary skill in the relevant subspecialty of plasma drive circuits will recognize that these factors can be balanced against each other, and the number of pull-down thyristors reduced from three to two, or possibly to one, with careful design.

Figure 10:
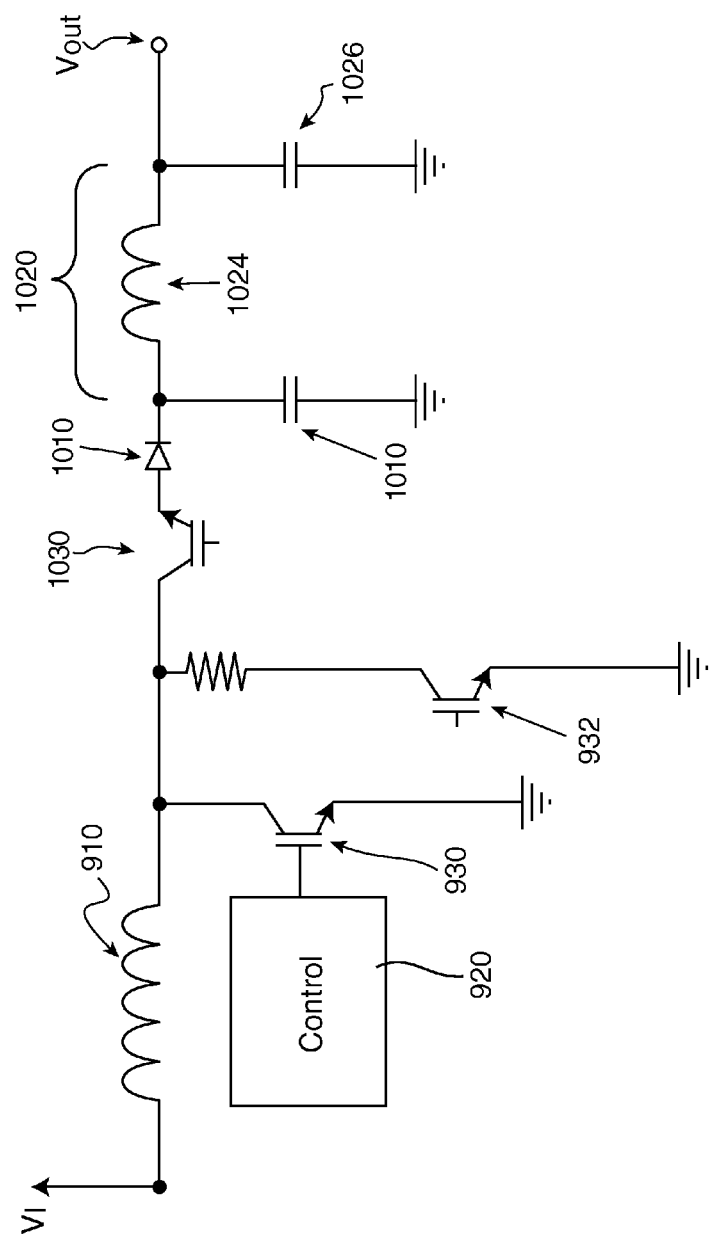
FIG. 10 shows an example of a power supply.

FIG. 10 shows a very simple example of a power supply. In this example the same configuration of pull-down thyristor is used as was shown in FIG. 9. In addition, a series switch is implemented by another thyristor 1030. This is a conventional power-supply circuit (simplified), but the key point is that thyristor 1030 and thyristor 930 can both be integrated on the same chip, to drive discrete inductor 910 and output filter 1020. A diode 1010 can optionally be interposed between thyristor 1030 and output filter 1020, but this is preferably not used unless absolutely necessary. Output filter 1020, in this example, is shown as a very simple pi filter combination of capacitor 1022, inductor 1024, and capacitor 1026. A small resistance can be added in series with capacitor 1026 to avoid oscillation, if needed. Optional thyristor 932 and resistor 934 provide a snubber function, as before.

Figure 11:
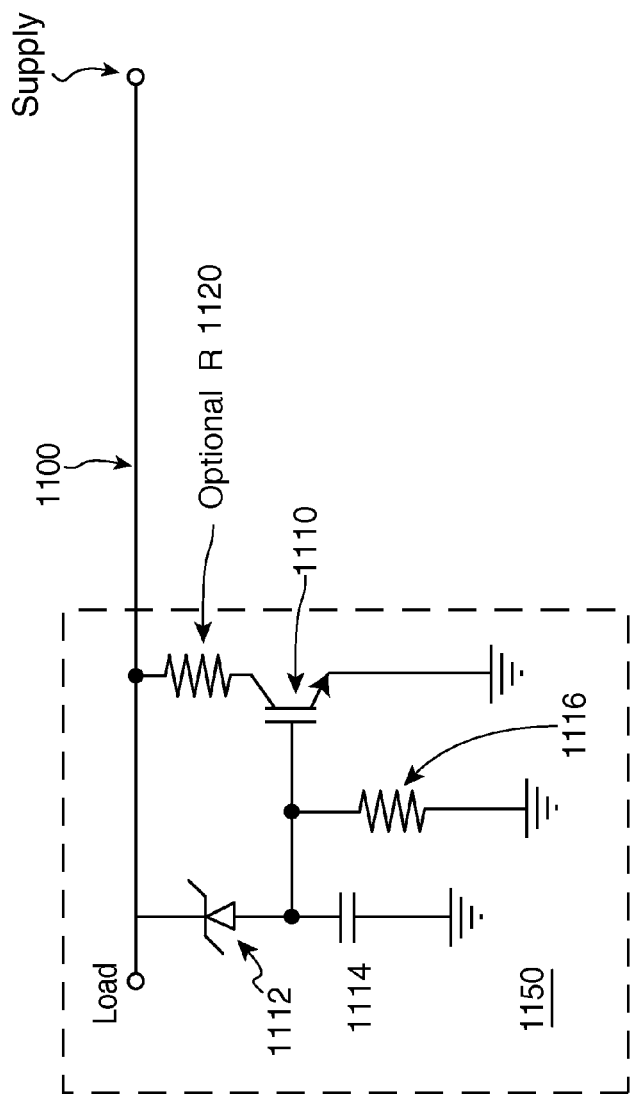
FIG. 11 shows an example of a crowbar snubber configuration.

FIG. 11 shows an example of a lateral thyristor, according to FIG. 1 or FIGS. 4A-4C used in a crowbar snubber. In this example a load module 1150—which can be, for example, a motor controller as in FIG. 7, or an actuator controller as in FIG. 12—includes, on a single chip (like that of FIG. 6A for example), a snubbing thyristor 1110 (like those of FIG. 1 or 4A-4C, or their equivalents). An avalanche diode stack 1112 pulls the gate terminal of the thyristor 1110 high when a voltage spike occurs (e.g. due to electrostatic discharge). A small capacitor 1114 imposes a time constant at the gate of the thyristor, and avalanche diode 1116 limits the voltage on this gate. Note that diode 1116 preferably has a larger current limit than diode stack 1112, so that diode 1116 will define the voltage limit on the gate.

Figure 12:
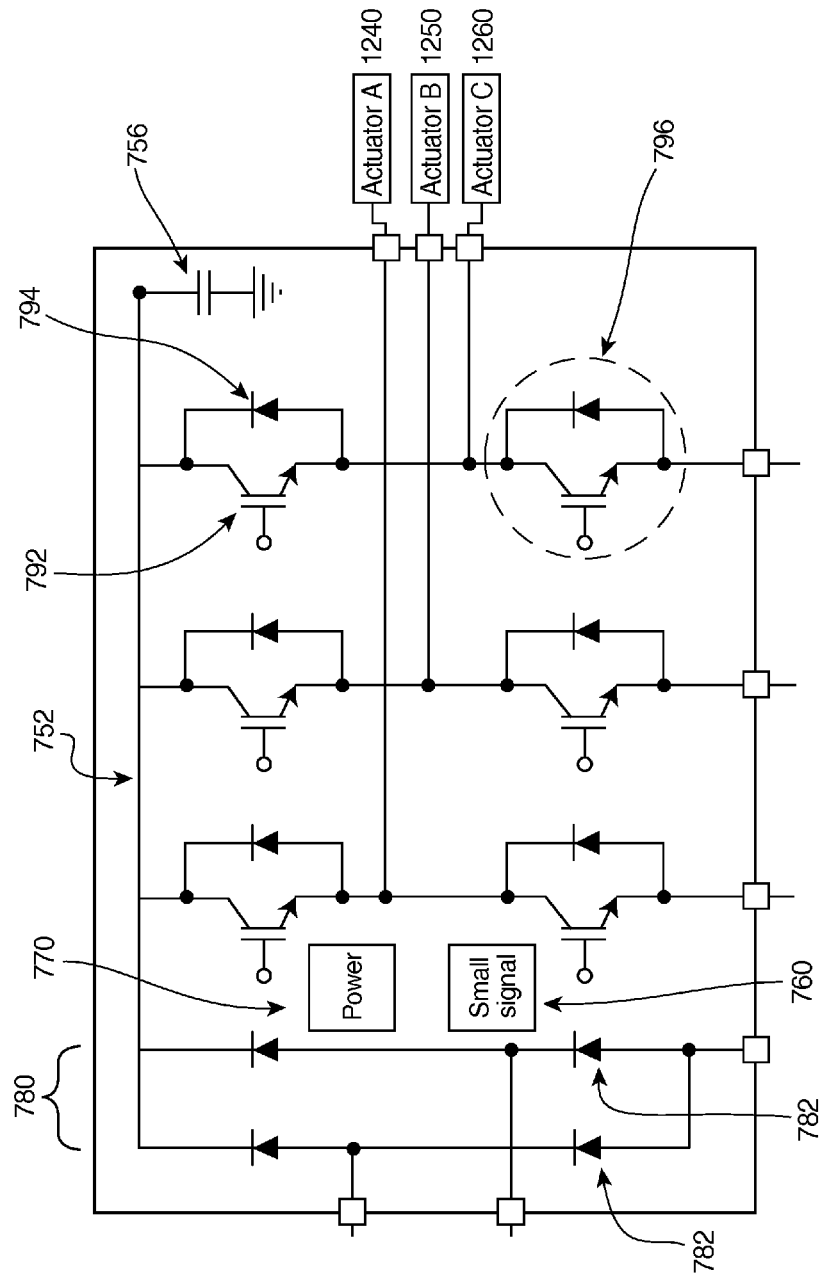
FIG. 12 shows an example of an actuator.

FIG. 12 shows an example of an actuator drive circuit, in which actuators 1240, 1260, and 1280 can be solid or piezoelectric or other actuators. Actuators 1240, 1260, and 1280 can be identical or different.

Figure 13:
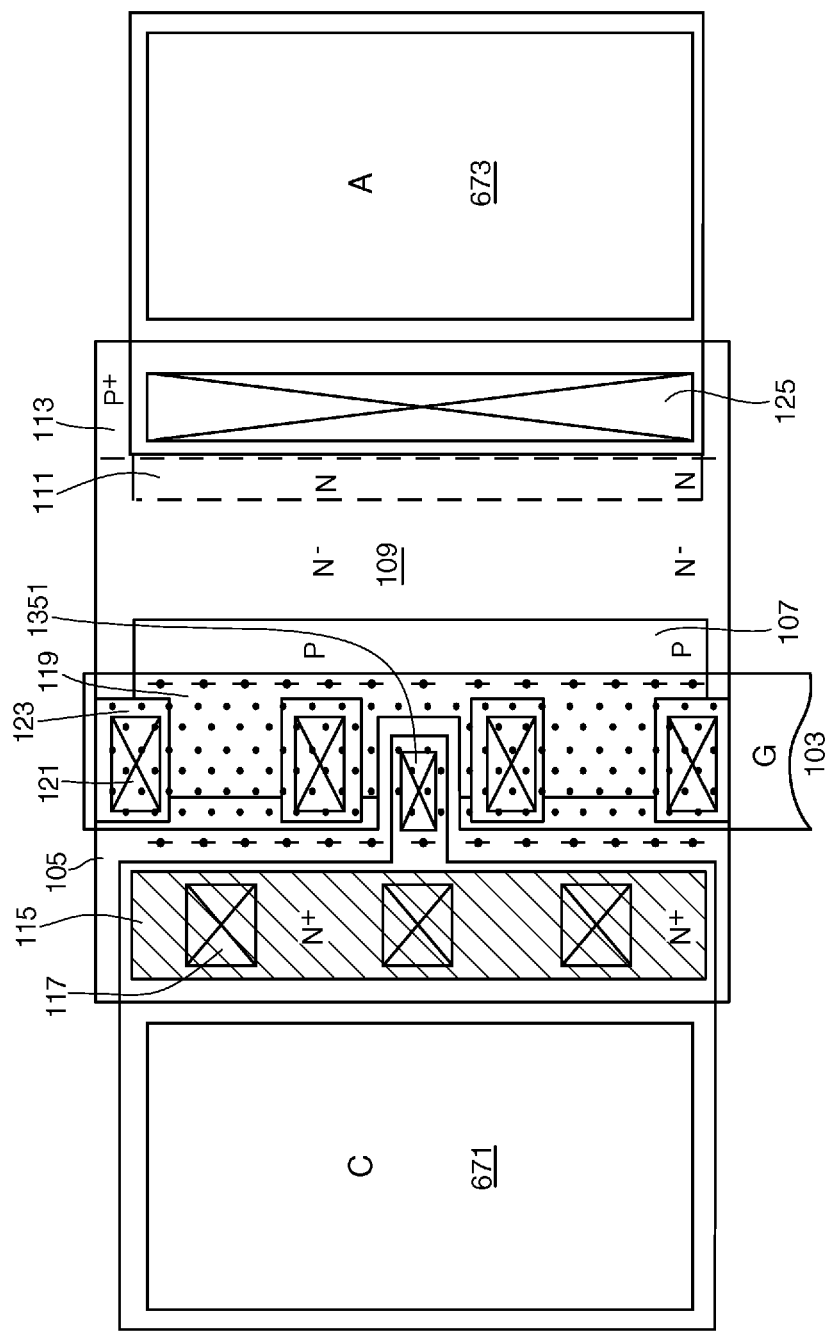
FIG. 13 shows an example of a lateral MOS-controlled thyristor with emitter-base shorting.

FIG. 13 shows a lateral IGTO as in e.g. FIG. 6B, with added element 1351, which provides switchable emitter-base shorting.

Figure 14:
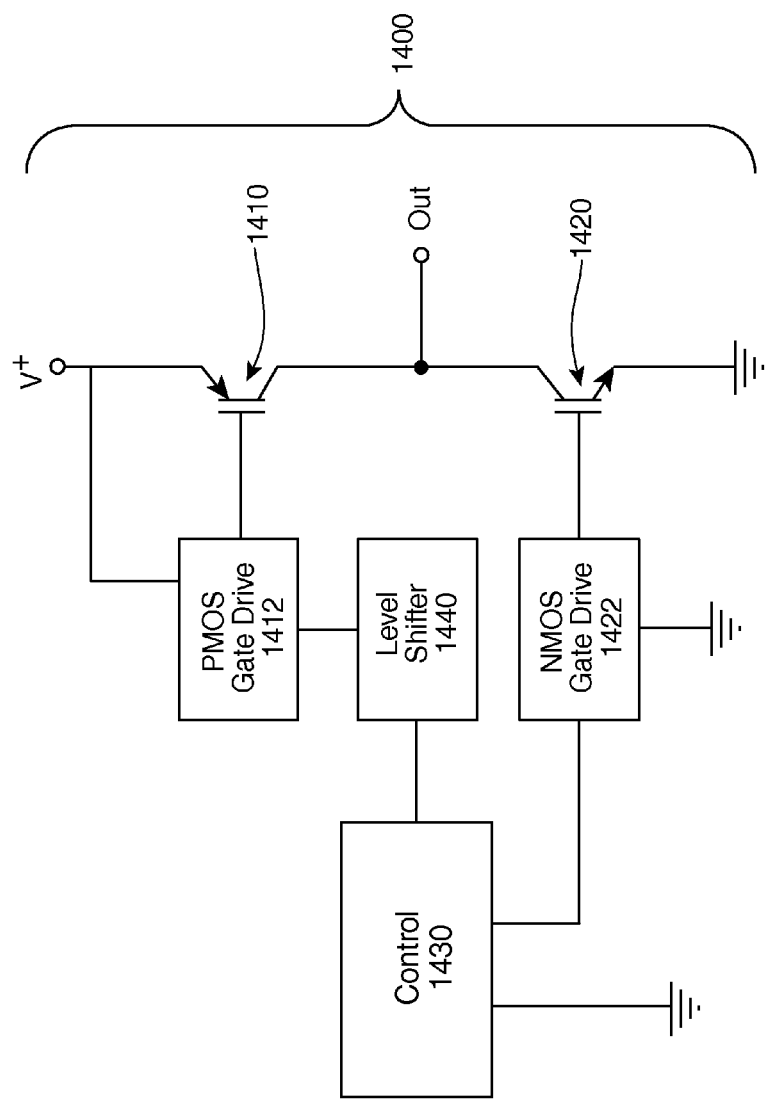
FIG. 14 shows an example of an unusual phase leg configuration, achieved using thyristors like those of FIGS. 4A-4C.

FIG. 14 shows a phase leg 1400 which includes not only an integrated NMOS-controlled thyristor 1420 like that of FIG. 1 or FIGS. 4A-4C or their equivalents, but also a PMOS-controlled thyristor 1410. Preferably both thyristors 1410 and 1420 are fully-isolated lateral devices on an SOI structure. However, thyristor 1410 has completely opposite polarity to diode 1420: its gate is located at the boundary between the p+ anode region and the n-type base region, and an inversion layer is generated within the n-type base region when the gate voltage is sufficiently below the voltage of the anode. This provides a population of holes (when the gate is on) at the portion of the gate nearest the p-type base. Preferably the dimensions are selected so that latching will occur when the PMOS gate has turned on, but will not be sustained otherwise. Since the mobility of holes in silicon is much less than that of electrons, the PMOS-gated thyristor 1410 preferably has a larger total channel cross-section than the NMOS-gated thyristor 1420 does.

NMOS gate drive circuitry 1422 drives the gate of thyristor 1420. PMOS gate drive circuitry 1412 drives the gate of thyristor 1410. Optional level shifter 1440 provides a correct signal translation for the PMOS gate drive circuitry 1412. (A supply voltage connection from the high voltage V+ terminal to PMOS gate drive 1412 is shown, to emphasize the relation between V+ and the required gate voltage.) Control circuitry 1430 provides overall timing control.

According to some but not necessarily all embodiments, there is provided: Methods and systems for lateral switched-emitter thyristors in a single-layer implementation. Lateral operation is advantageously achieved by using an embedded gate. Embedded gate plugs are used to controllably invert a portion of the P-base region, so that the electron population at the portion of the inversion layer which is closest to the anode will provide a virtual emitter, and will provide sufficient gain so that the combination of bipolar devices will then go into latchup.

According to some but not necessarily all embodiments, there is provided: A lateral thyristor device, comprising: a semiconductor layer which is positioned atop a layer of insulator, and is completely isolated by trenches on all sides thereof; a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; a plurality of embedded gate electrodes spaced along the boundary between said p-type base region and said n-type emitter region, each said gate electrode being capacitively coupled to a portion of said p-type base region which is nearest said n+ emitter region; all of said gate electrodes which are adjacent said n+ emitter region being electrically connected together; wherein, when said gate inverts an adjacent portion of said p-type base region, a population of electrons, at a surface of said gate nearest said n-type base region provides a virtual emitter and thereby sustains latchup once conduction has been initiated; and wherein the combination of said n+ emitter and said p-type base, and the combination of said p+ emitter and said n-type base, are not jointly able to sustain latching if said gate has not inverted adjacent portions of said p-type base region.

According to some but not necessarily all embodiments, there is provided: A lateral thyristor device, comprising: a semiconductor layer which is positioned atop a layer of insulator, and is completely isolated by trenches on all sides thereof; a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; a plurality of embedded gate electrodes spaced along the boundary between said p-type base region and said n+ emitter region, each said gate electrode being capacitively coupled to a portion of said p-type base region which is nearest said n+ emitter region; all of said gate electrodes which are adjacent said n+ emitter region being electrically connected together by a surface layer of the same material; wherein said gate electrodes have a spacing which completely depletes through all of said p-type base material along a plane which separates said n-type emitter region from said n-type base region, when said gate electrode is driven negative; and wherein, when said gate inverts an adjacent portion of said p-type base region, a population of electrons, at a surface of said gate nearest said n-type base region, provides a virtual emitter and thereby sustains latchup once conduction has been initiated.

According to some but not necessarily all embodiments, there is provided: A lateral thyristor device, comprising: a semiconductor layer which is positioned atop a layer of insulator, and is completely isolated by trenches on all sides thereof; a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter, and is located at the other end of said length of said semiconductor layer; a plurality of embedded gate electrodes spaced along the boundary between said p-type base region and said n-type emitter region, each said gate electrode extending through the full thickness of said p-type gate region and being capacitively coupled to a portion of said p-type base region which is nearest said n+ emitter region; all of said gate electrodes which are adjacent said n+ emitter region being electrically connected together; wherein said n+ emitter region is laterally contacted by a conductor, and has a doping profile which is vertically uniform; and wherein the junction between said n+ emitter and said p-type base, and the junction between said p+ emitter and said n-type base, will jointly latch to maintain conduction, during the on state, for as long as said gate inverts an adjacent part of said p-type base region.

According to some but not necessarily all embodiments, there is provided: A lateral thyristor device, comprising: a semiconductor layer which is positioned atop a layer of insulator, and is completely isolated by trenches on all sides thereof; a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; a plurality of embedded gate electrodes spaced along the boundary between said n-type base region and said p-type emitter region, each said gate electrode being capacitively coupled to a portion of said n-type base region which is nearest said p+ emitter region; all of said gate electrodes which are adjacent said p+ emitter region being electrically connected together; wherein the junction between said n+ emitter and said p-type base, and the junction between said p+ emitter and said n-type base, will jointly latch to maintain conduction, during the on state, for as long as said gate inverts an adjacent part of said p-type base region; and wherein the combination of said n+ emitter and said p-type base, and the combination of said p+ emitter and said n-type base, are not jointly able to sustain latching if said gate has not inverted adjacent portions of said n-type base region.

According to some but not necessarily all embodiments, there is provided: A method of fabricating a lateral gated thyristor, comprising: introducing dopants into a layer of semiconductor on insulator to form a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; forming repeated gate trenches extending through the full thickness of the p-base region, at locations along the boundary of said p-base region with said n+ emitter region; forming a gate insulator on walls of said trenches; depositing a conductive material to form a gate electrode in each of said gate trenches; making electrical contact to each of said gate electrodes, and to said n+ emitter, and to said p+ emitter; reducing carrier lifetimes in at least one of said n-type base and said p-type base, so that latchup cannot occur unless said gate electrodes are inverting adjacent portions of said n-type base.

According to some but not necessarily all embodiments, there is provided: A method of fabricating a lateral gated thyristor, comprising: introducing dopants into a layer of semiconductor on insulator to form a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; forming repeated gate trenches extending through the full thickness of the p-base region, at locations along the boundary of said p-base region with said n+ emitter region; forming a gate insulator on walls of said trenches; depositing a conductive material to form a gate electrode in each of said gate trenches; and making electrical contact to each of said gate electrodes, and to said n+ emitter, and to said p+ emitter.

According to some but not necessarily all embodiments, there is provided: A method of fabricating a lateral gated thyristor, comprising: beginning with a layer of semiconductor on insulator; introducing dopants into the layer of semiconductor to form an n+ emitter region, and a p-type base region adjacent thereto, and an n-type base region adjacent to said p-type base region but not to said n+ emitter region, and a p+ emitter region which adjoins said n-type base region but not said p-type base region nor said n+ emitter region; forming repeated gate trenches extending at least partly into the n+ emitter region and at least partly into the p+ emitter region; forming a gate insulator on walls of said trenches; depositing a patterned conductive material to form a gate electrode in each of said gate trenches, and to form lateral connections between adjacent ones of said gate electrodes; and making electrical contact to each of said gate electrodes, and to said n+ emitter region, and to said p+ emitter region.

According to some but not necessarily all embodiments, there is provided: A method of fabricating a lateral gated thyristor, comprising: introducing dopants into a layer of semiconductor on insulator to form a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; forming repeated gate trenches extending through the full thickness of the p-type base region at the boundary of the n+ emitter region; forming a gate insulator on walls of said trenches; depositing a conductive material to form an insulated gate electrode in each of said gate trenches; and making electrical contact to each of said gate electrodes, and to said n+ emitter, and to said p+ emitter; and reducing carrier lifetime in at least one of said n-type base and said p-type base, to avoid unwanted latchup.

According to some but not necessarily all embodiments, there is provided: A method of fabricating a lateral gated thyristor, comprising: introducing dopants into a layer of semiconductor on insulator to form a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter; forming repeated gate trenches extending through the full thickness of the n-base region, at locations along the boundary of said n-base region with said p+ emitter region; forming a gate insulator on walls of said trenches; depositing a conductive material to form a gate electrode in each of said gate trenches; and making electrical contact to each of said gate electrodes, and to said n+ emitter, and to said p+ emitter.

According to some but not necessarily all embodiments, there is provided: A motor system comprising: multiple phase legs on a single chip, each said phase leg being connected to drive at least one respective terminal of a motor; Wherein said phase legs each comprise at least one lateral MOS-controlled thyristor having embedded gates, and are located on more than one separate island of a single SOI semiconductor chip.

According to some but not necessarily all embodiments, there is provided: An actuator system comprising: One or more MOS-controlled lateral thyristors located on separate respective islands of a single SOI semiconductor chip; and Control circuitry located on another island of the SOI chip; Wherein at least one of said thyristors is connected to drive at least one terminal of an electromechanical actuator.

According to some but not necessarily all embodiments, there is provided: A power supply comprising: one or more discrete lump reactances; and one or more lateral MOS-controlled thyristors with embedded gates, on a single SOI semiconductor chip, multiple ones of said thyristors being located on different islands of the SOI chip; and control circuitry located on another island of the SOI chip, and connected to drive ones of said thyristors.

According to some but not necessarily all embodiments, there is provided: A plasma-discharge system comprising: An enclosed volume of gas; A driver circuit, connected to apply current to said volume of gas, which includes one or more discrete lump reactances; and one or more lateral MOS-controlled thyristors with embedded gates, on a single SOI semiconductor chip, multiple ones of said thyristors being located on different islands of the SOI chip; and control circuitry located on another island of the SOI chip, and connected to drive ones of said thyristors.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In the most preferred embodiment, the IGTO is a controllably-latching virtual-emitter device as described in co-pending application Ser. No. 13/632,991, but in a less preferred embodiment, the IGTO is a virtual emitter device as described in Rodov.

In the most preferred embodiment, the gate contact is a metal layer that contacts the poly layer over each of the embedded gates. In one less preferred embodiment, the poly can be run outside of the device and can be contacted by the metal there.

In one alternative embodiment of a thick-layer lateral device, the P base dopants can be implanted, rather than introduced through the trenches.

Optionally, a leakdown resistor can be used to avoid bias levels from going beyond acceptable limits.

It is also possible to have a thyristor structure which combines an NMOS-gated lateral SOI thyristor with a PMOS-gated lateral SOI thyristor. This provides an additional degree of fabrication complexity, but is another structural implementation which is provided by the present application.

This is particularly useful for voltages in the range of 70-700 V, but can also be used for other voltages.

Additional general background, which helps to show variations and implementations, may be found in the following publications, all of which are hereby incorporated by reference: Issued U.S. Pat. No. 7,705,368 to Rodov and Akiyama, which is commonly owned with the present application; Baliga, *Fundamentals of Power Semiconductor Devices*; Carr, *DC Power Supplies: A Technician's Guide* (1996); Jowett, *Electronic devices in industry* (1984); Bird, *Introduction to Power Electronics* (1983); Shah, *Simplifying Power Supply Technology* (1995); Wood, *Switching power converters* (1984); Dewan and Straughen, *Power semiconductor circuits* (1975); Billings, *Handbook of switchmode power supplies* (1989); *IEEE PES conference proceedings (all years)*; Gottlieb, *Power Supplies, Switching Regulators, Inverters, and Converters* (1993); Wu, *Pulse Width Modulated DC/DC Converters* (1997); Mohan et al., *Power Electronics: Converters, Applications, and Design* (2.ed. 1995); Oxner, *Designing with Field Effect Transistors* (1989); *High voltage integrated circuits* (1988); Billings, *Switchmode Power Supply Handbook* (2.ed. 1998); Trzynadlowski, *Introduction to Modern Power Electronics* (1998); Antognetti, *Power integrated circuits* (1986); Schwarz, *Design of industrial electric motor drives* (1991); Pressman, *Switching power supply design* (1991); Middlebrook and Slobodan Cuk, *Advances in switched-mode power conversion (Vols. 1+2 together, and volume 3)* (1981); ISPSD conference proceedings (all years). All of these publications are hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following US patent applications. All of these applications have at least some common ownership, co-pendency, and inventorship with the present application, and all of them are hereby incorporated by reference: Ser. No. 13/632,991 filed Oct. 1, 2012; Ser. No. 13/648,516 filed Oct. 10, 2012; 61/540,819 filed Oct. 1, 2011; 61/545,567 filed Oct. 10, 2011; 61/678,724 filed Aug. 2, 2012; 61/678,729 filed Aug. 2, 2012; 61/708,048 filed Oct. 1, 2012; 61/708,049 filed Oct. 1, 2012. Applicants reserve the right to claim priority from these applications, in any and all countries where such priority can be claimed.

The claims as filed are intended to be as comprehensive as possible, and NO subject matter is intentionally relinquished, dedicated, or abandoned.

What is claimed is:

1. A lateral thyristor device, comprising:
   a semiconductor layer which is positioned atop a layer of insulator, and is completely isolated by trenches on all sides thereof;
   a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter;
   a first current carrying terminal contacting the n+ emitter region;
   a second current carrying terminal contacting the p+ emitter region, wherein the first current carrying terminal and the second current carrying terminal are located over a top surface of the semiconductor layer to form a lateral current-conduction device;
   a plurality of embedded gate electrodes spaced along the boundary between said p-type base region and said n-type emitter region, each said gate electrode being capacitively coupled to a portion of said p-type base region which is nearest said n+ emitter region; all of said gate electrodes which are adjacent said n+ emitter region being electrically connected together;

wherein, when said gate inverts an adjacent portion of said p-type base region, a population of electrons, at a surface of said gate nearest said n-type base region provides a virtual emitter and thereby sustains latchup once conduction has been initiated; and wherein the combination of said n+ emitter and said p-type base, and the combination of said p+ emitter and said n-type base, are not jointly able to sustain latching if said gate has not inverted adjacent portions of said p-type base region.

2. The device of claim 1, wherein said thyristor cannot sustain latchup at its rated current in the off state, and can initiate and sustain latchup when the gate electrode is inverting adjacent portions of said p-type base region.

3. The device of claim 1, wherein said semiconductor layer is more than 4 microns thick, and said n+ emitter region has a doping profile which is vertically uniform.

4. The device of claim 1, wherein said semiconductor layer is more than 4 microns thick, and said n+ emitter region and said p-type base region and said n-type base region each have a doping profile which is vertically uniform.

5. The device of claim 1, wherein said semiconductor layer is less than 3 microns thick.

6. The device of claim 1, wherein said n-type base region is much wider than said n+ emitter region.

7. The device of claim 1, wherein said p-type base region is much wider than said p+ emitter region.

8. The device of claim 1, wherein each of said trenches has a maximum diameter which is less than 150% of a minimum diameter thereof.

9. The device of claim 1, wherein said conductive material is polysilicon.

10. A lateral thyristor device, comprising:
a semiconductor layer which is positioned atop a layer of insulator, and is completely isolated by trenches on all sides thereof;
a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter;
a plurality of embedded gate electrodes spaced along the boundary between said p-type base region and said n+ emitter region, each said gate electrode being capacitively coupled to a portion of said p-type base region which is nearest said n+ emitter region; all of said gate electrodes which are adjacent said n+ emitter region being electrically connected together by a surface layer of the same material;
wherein said gate electrodes have a spacing which completely depletes through all of said p-type base material along a plane which separates said n-type emitter region from said n-type base region, when said gate electrode is driven negative; and
wherein, when said gate inverts an adjacent portion of said p-type base region, a population of electrons, at a surface of said gate nearest said n-type base region, provides a virtual emitter and thereby sustains latchup once conduction has been initiated.

11. The device of claim 10, wherein said thyristor cannot sustain latchup at its rated current in the off state, and can initiate and sustain latchup when the gate electrode is inverting adjacent portions of said p-type base region.

12. The device of claim 10, wherein said thyristor cannot sustain latchup in the off state, and can sustain latchup when the gate electrode is inverting adjacent portions of said p-type base region.

13. The device of claim 10, wherein said semiconductor layer is more than 4 microns thick, and said n+ emitter region has a doping profile which is vertically uniform.

14. The device of claim 10, wherein said semiconductor layer is more than 4 microns thick, and said n+ emitter region and said p-type base region and said p+ emitter region each have a doping profile which is vertically uniform.

15. The device of claim 10, wherein said n-type base region is much wider than said n+ emitter region, and said p-type base region is much wider than said p+ emitter region.

16. The device of claim 10, wherein each of said trenches has a maximum diameter which is less than 150% of a minimum diameter thereof.

17. The device of claim 10, wherein said conductive material is polysilicon.

18. A lateral thyristor device, comprising:
a semiconductor layer which is positioned atop a layer of insulator, and is completely isolated by trenches on all sides thereof;
a heavily-doped n+ emitter region at one end of a length of said semiconductor layer, and a lightly doped p-type base region adjacent said n+ emitter region, and a lightly doped n-type base region adjacent to said p-type base region but not to said n+ emitter region, and a heavily doped p+ emitter region which abuts said lightly doped n-type base region but not said lightly doped p-type base region nor said heavily doped n+ emitter, and is located at the other end of said length of said semiconductor layer;
a plurality of embedded gate electrodes spaced along the boundary between said p-type base region and said n-type emitter region, each said gate electrode extending through the full thickness of said p-type gate region and being capacitively coupled to a portion of said p-type base region which is nearest said n+ emitter region; all of said gate electrodes which are adjacent said n+ emitter region being electrically connected together;
wherein said n+ emitter region is laterally contacted by a conductor, and has a doping profile which is vertically uniform;
and wherein the junction between said n+ emitter and said p-type base, and the junction between said p+ emitter and said n-type base, will jointly latch to maintain conduction, during the on state, for as long as said gate inverts an adjacent part of said p-type base region.

19. The device of claim 18, wherein said thyristor cannot sustain latchup at its rated current in the off state, and can sustain latchup when the gate electrode is inverting adjacent portions of said p-type base region.

20. The device of claim 18, wherein said thyristor cannot sustain latchup at its rated current in the off state, and can initiate and sustain latchup when the gate electrode is inverting adjacent portions of said p-type base region.

* * * * *